United States Patent
Kamepalli et al.

(10) Patent No.: US 11,221,683 B2
(45) Date of Patent: Jan. 11, 2022

(54) GRAPHICAL USER INTERFACE (GUI) MANIPULATION USING HAND GESTURES OVER A HOVERING KEYBOARD

(71) Applicant: Dell Products, L.P., Round Rock, TX (US)

(72) Inventors: Srinivas Kamepalli, Austin, TX (US); Deeder M. Aurongzeb, Austin, TX (US)

(73) Assignee: Dell Products, L.P., Round Rock, TX (US)

( * ) Notice: Subject to any disclaimer, the term of this patent is extended or adjusted under 35 U.S.C. 154(b) by 0 days.

(21) Appl. No.: 16/408,274

(22) Filed: May 9, 2019

(65) Prior Publication Data

US 2020/0356184 A1    Nov. 12, 2020

(51) Int. Cl.
| | |
|---|---|
| *G06F 3/02* | (2006.01) |
| *G06F 3/0489* | (2013.01) |
| *G06F 3/0484* | (2013.01) |
| *G06F 3/01* | (2006.01) |
| *H03K 17/945* | (2006.01) |
| *H01H 13/83* | (2006.01) |

(52) U.S. Cl.
CPC ............ *G06F 3/0219* (2013.01); *G06F 3/011* (2013.01); *G06F 3/017* (2013.01); *G06F 3/0489* (2013.01); *G06F 3/04845* (2013.01); *H01H 13/83* (2013.01); *H03K 17/945* (2013.01); *H01H 2219/036* (2013.01)

(58) Field of Classification Search
CPC ........ G06F 3/0219; G06F 3/011; G06F 3/017; G06F 3/0489; G06F 3/04845; G06F 2203/04108; G06F 3/0202; H01H 13/83; H01H 2219/036; H03K 17/945
See application file for complete search history.

(56) References Cited

U.S. PATENT DOCUMENTS

| | | | |
|---|---|---|---|
| 6,779,060 B1 * | 8/2004 | Azvine | G06F 3/038 710/65 |
| 6,842,175 B1 * | 1/2005 | Schmalstieg | G06F 3/011 345/427 |
| 9,383,895 B1 * | 7/2016 | Vinayak | G06F 3/017 |
| 9,898,347 B1 * | 2/2018 | Gupta | G06F 9/5072 |
| 2006/0210958 A1 * | 9/2006 | Rimas-Ribikauskas | G09B 7/00 434/362 |
| 2007/0271466 A1 * | 11/2007 | Mak | G06F 21/316 713/184 |
| 2008/0042978 A1 * | 2/2008 | Perez-Noguera | G06F 3/023 345/168 |
| 2008/0178126 A1 * | 7/2008 | Beeck | G09B 5/06 715/863 |

(Continued)

*Primary Examiner* — Patrick N Edouard
*Assistant Examiner* — Joseph P Fox
(74) *Attorney, Agent, or Firm* — Fogarty LLP (57) ABSTRACT

Systems and methods for enabling a Graphical User Interface (GUI) manipulation using hand gestures over a hovering keyboard are described. In some embodiments, an Information Handling System (IHS) may include a processor and a memory coupled to the processor, the memory having program instructions stored thereon that, upon execution by the processor, cause the IHS to: detect a hand gesture using proximity sensors disposed on a hovering keyboard coupled to the IHS, and manipulate a task map rendered on a display coupled to the IHS in response to the detection.

16 Claims, 8 Drawing Sheets

(56) References Cited

U.S. PATENT DOCUMENTS

| | | | | |
|---|---|---|---|---|
| 2009/0044988 A1* | 2/2009 | Chang | | G06F 3/0416 |
| | | | | 178/18.01 |
| 2009/0128492 A1* | 5/2009 | Yoo | | G06F 3/0219 |
| | | | | 345/168 |
| 2010/0138797 A1* | 6/2010 | Thorn | | G06F 3/017 |
| | | | | 715/863 |
| 2010/0295772 A1* | 11/2010 | Alameh | | G06F 3/017 |
| | | | | 345/156 |
| 2011/0205161 A1* | 8/2011 | Myers | | G06F 3/0238 |
| | | | | 345/169 |
| 2011/0235926 A1* | 9/2011 | Yokono | | G06K 9/6224 |
| | | | | 382/225 |
| 2012/0182215 A1* | 7/2012 | Han | | G06F 3/0202 |
| | | | | 345/156 |
| 2013/0076635 A1* | 3/2013 | Lin | | G06F 3/0202 |
| | | | | 345/169 |
| 2013/0228023 A1* | 9/2013 | Drasnin | | G06F 1/1654 |
| | | | | 73/862.541 |
| 2014/0043232 A1* | 2/2014 | Kurokawa | | G06F 3/017 |
| | | | | 345/156 |
| 2014/0055348 A1* | 2/2014 | Sudo | | G06F 3/0481 |
| | | | | 345/156 |
| 2014/0068526 A1* | 3/2014 | Figelman | | G06F 3/005 |
| | | | | 715/863 |
| 2014/0151212 A1* | 6/2014 | Chang | | H03K 17/975 |
| | | | | 200/5 A |
| 2014/0157210 A1* | 6/2014 | Katz | | G06F 3/017 |
| | | | | 715/863 |
| 2014/0168062 A1* | 6/2014 | Katz | | G06F 3/0484 |
| | | | | 345/156 |
| 2014/0191972 A1* | 7/2014 | Case | | G06F 3/0489 |
| | | | | 345/168 |
| 2014/0298266 A1* | 10/2014 | Lapp | | G06F 3/04886 |
| | | | | 715/835 |
| 2015/0177842 A1* | 6/2015 | Rudenko | | G06F 21/32 |
| | | | | 345/156 |
| 2015/0268855 A1* | 9/2015 | Griffin | | G06F 3/0485 |
| | | | | 345/173 |
| 2015/0269555 A1* | 9/2015 | Clark | | G06Q 20/3221 |
| | | | | 705/39 |
| 2016/0116993 A1* | 4/2016 | Leyon | | G06F 3/04895 |
| | | | | 345/170 |
| 2016/0202898 A1* | 7/2016 | Bostick | | G06F 11/30 |
| | | | | 345/173 |
| 2016/0253044 A1* | 9/2016 | Katz | | G06F 3/04842 |
| | | | | 345/156 |
| 2016/0283105 A1* | 9/2016 | Maloo | | G06F 3/04883 |
| 2017/0068322 A1* | 3/2017 | Steinberg | | G06F 3/005 |
| 2018/0329491 A1* | 11/2018 | Stouffer | | G06F 3/017 |
| 2019/0289285 A1* | 9/2019 | Nashida | | A63F 13/21 |
| 2020/0011669 A1* | 1/2020 | Seth | | G01C 21/165 |
| 2020/0183645 A1* | 6/2020 | Hanes | | G06F 3/16 |

* cited by examiner

GRAPHICAL USER INTERFACE (GUI) MANIPULATION USING HAND GESTURES OVER A HOVERING KEYBOARD

FIELD

This disclosure relates generally to Information Handling Systems (IHSs), and more specifically, to systems and methods for enabling a Graphical User Interface (GUI) manipulation using hand gestures over a hovering keyboard.

BACKGROUND

As the value and use of information continues to increase, individuals and businesses seek additional ways to process and store information. One option available to users is Information Handling Systems (IHSs). An IHS generally processes, compiles, stores, and/or communicates information or data for business, personal, or other purposes thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

In various implementations, IHSs process information received via a keyboard. A conventional keyboard includes components such as scissor switch keys, dome switch keys, levers, membranes, bucking springs, etc. These components are configured to receive physical keystrokes when a user actually touches and/or presses the keyboard's keys.

In addition, certain types of keyboards now also come equipped with proximity sensors. These proximity sensors are configured to measure distances between the user's hand or fingers to the keyboard. In operation, such a keyboard can detect signals representative of proximity and, when appropriate, it can interpret them as "hovering keystrokes"—even in the absence of physical contact between the keyboard and the user's fingers.

SUMMARY

Embodiments of systems and methods for enabling a Graphical User Interface (GUI) manipulation using hand gestures over a hovering keyboard are described. In an illustrative, non-limiting embodiment, an Information Handling System (IHS) may include a processor and a memory coupled to the processor, the memory having program instructions stored thereon that, upon execution by the processor, cause the IHS to: detect a hand gesture using proximity sensors disposed on a hovering keyboard coupled to the IHS, and manipulate a task map rendered on a display coupled to the IHS in response to the detection.

To detect the hand gesture, the program instructions, upon execution, may cause the IHS to fit proximity data obtained by the proximity sensors to a geometric model of a hand, and the geometric model may include one or more parameters selected from the group consisting of: a length, a width, a joint position, an angle of joint rotation, and a finger segment.

In some cases, the hand gesture may include a hand inclination. To manipulate the task map, the program instructions, upon execution, may cause the IHS to render each of a plurality of tasks grouped in two or more layers, and a separation between each layer may be proportional to an angle of inclination of the hand. Also, the program instructions, upon execution, may cause the IHS to light a portion of the hovering keyboard under the hand inclination with a color or intensity corresponding to an angle of inclination.

In other cases, the hand gesture further may include a finger splaying following the hand inclination. To manipulate the task map, the program instructions, upon execution, may cause the IHS to separate the tasks rendered in each layer by a distance proportional to an amount of finger splaying. Moreover, the program instructions, upon execution, may cause the IHS to light a portion of the hovering keyboard under the finger splaying with a color or intensity corresponding to the amount of finger splaying.

In yet other cases, the hand gesture further may include a finger pointing following the finger splaying. To manipulate the task map, the program instructions, upon execution, may cause the IHS to identify one of the plurality of tasks selected by the finger pointing, and to render an application associated with the selected task.

To manipulate the task map, the program instructions, upon execution, may cause the IHS to: maintain a record of hand gestures performed by a given user, calculate a drift based on the record of hand gestures, and adjust one or more parameters used to detect the hand gesture based upon the drift. For example, to calculate the drift, the program instructions, upon execution, may cause the IHS to create a fuzzy set of hand gestures.

In another illustrative, non-limiting embodiment, a method may include: detecting a hand gesture using proximity sensors disposed on a hovering keyboard coupled to an IHS, and manipulating a task map rendered on a display coupled to the IHS in response to the detection.

The hand gesture may include a hand inclination, and the method may include rendering each of a plurality of tasks grouped in two or more layers, and wherein a separation between each layer is proportional to an angle of inclination of the hand. Additionally, or alternatively, the hand gesture may include a finger splaying following the hand inclination, and the method further comprises separating the tasks rendered in each layer by a distance proportional to an amount of finger splaying. Additionally, or alternatively, hand gesture may include a finger pointing following the finger splaying, and the method further may include identifying one of the plurality of tasks selected by the finger pointing, and to render an application associated with the selected task.

In yet another illustrative, non-limiting embodiment, a hardware memory device may have program instructions stored thereon that, upon execution by a processor of an IHS, cause the IHS to: detect a hand gesture using proximity sensors disposed on a hovering keyboard coupled to the IHS, and manipulate a task map rendered on a display coupled to the IHS in response to the detection.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity and have not necessarily been drawn to scale.

DETAILED DESCRIPTION

For purposes of this disclosure, an IHS may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an IHS may be a personal computer (e.g., desktop or laptop), tablet computer, mobile device (e.g., Personal Digital Assistant (PDA) or smart phone), server (e.g., blade server or rack server), a network storage device, or any other suitable device and may vary in size, shape, performance, functionality, and price. An IHS may include Random Access Memory (RAM), one or more processing resources such as a Central Processing Unit (CPU) or hardware or software control logic, Read-Only Memory (ROM), and/or other types of nonvolatile memory. Additional components of an IHS may include one or more disk drives, one or more network ports for communicating with external devices as well as various I/O devices, such as a keyboard, a mouse, touchscreen, and/or a video display. An IHS may also include one or more buses operable to transmit communications between the various hardware components.

Figure 1:
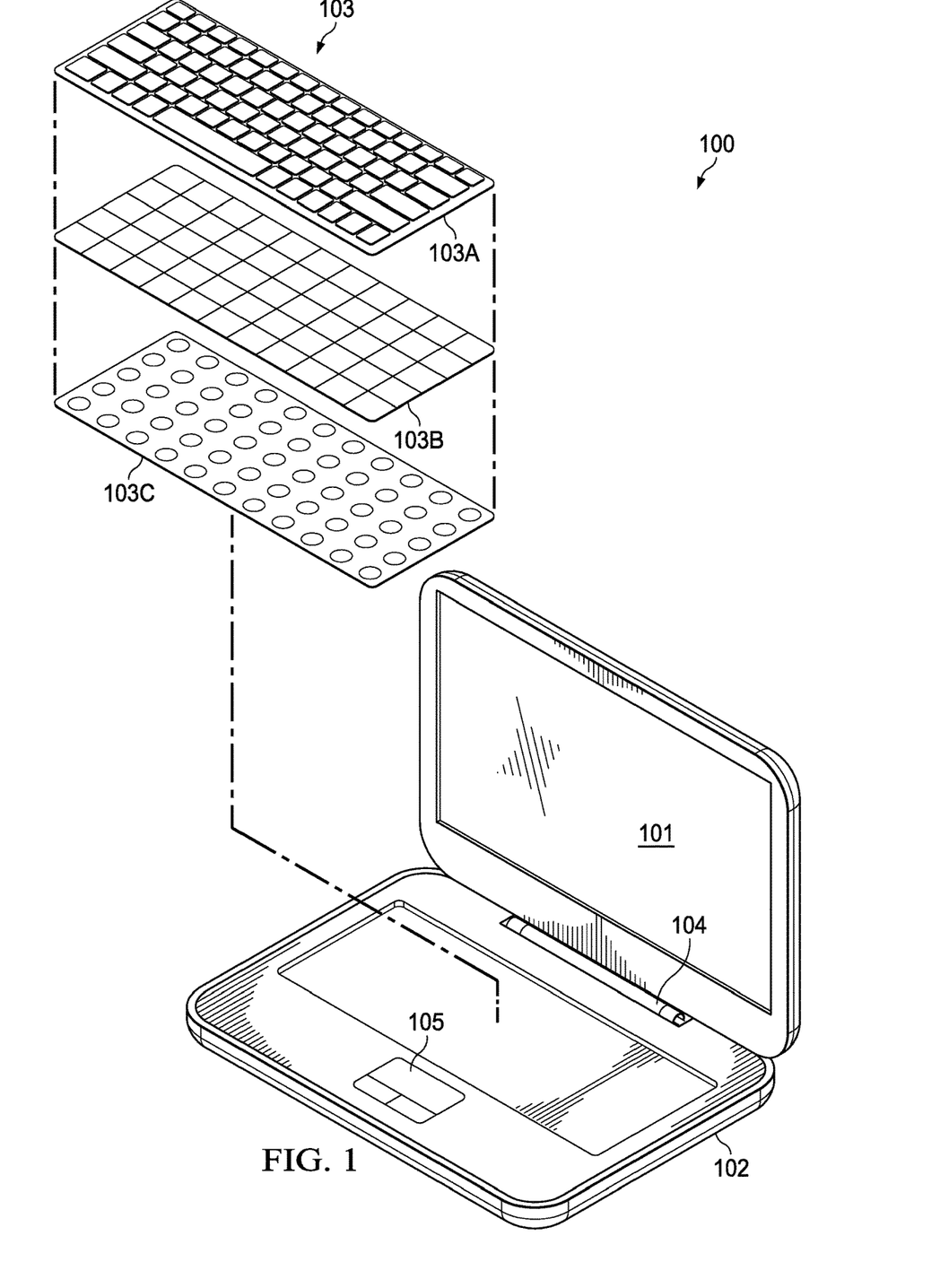
FIG. 1 is a perspective view of an Information Handling System (IHS) with a hovering keyboard, according to some embodiments.

FIG. 1 is a perspective view of Information Handling System (IHS) 100 with hovering keyboard 103. In this illustrative, non-limiting embodiment, IHS 100 includes display 101 and base or chassis 102, coupled to each other via hinge 104. Chassis 102 includes trackpad 105 or the like, and it holds keyboard 103. In this implementation, IHS 100 has a laptop or notebook form factor, such that keyboard 103 is directly integrated thereto. In other implementations, however, IHS 100 may be a desktop computer, video game console, appliance, etc., and keyboard 103 may be a peripheral keyboard separate from IHS 100. In those cases, keyboard 103 may be coupled to IHS 100 via a cable or wire (e.g., over a PS/2 connector, USB bus, etc.) or wirelessly (e.g., Bluetooth). Inputs made at keyboard 103 are communicated to keyboard controller 300 (shown in FIG. 3) for use by IHS 100.

In this example, hovering keyboard 103 is depicted with three layers or membranes: an electromechanical layer 103A, backlight illumination layer 103B, and proximity sensing layer 103C. When hovering keyboard 103 is assembled, layers 103A-C are stacked on top of each other to operate as follows: Electromechanical layer 103A is where keycap assemblies reside, and it is configured to detect physical keypresses against key caps; backlight illumination layer 103B comprises a plurality of LEDs configured to illuminate key caps from the bottom up; and proximity sensing layer is configured to detect hovering keypresses, such that in some cases, a finger's proximity to a key cap, without actually touching it, can also be detected as a keypress.

In other hovering keyboard implementations, the order in which layers 103B and 103C are stacked may be different than what is shown in FIG. 1. In some cases, layers 103A-C may be combined: for example, layers 103B and 103C may be provided as a single membrane.

With respect to electromechanical layer 103A, key caps extend out of an upper surface of keyboard 103 to provide a user with selectable inputs based upon the characters associated with the keys, such as a QWERTY keyboard that provides ASCI binary code inputs to the keyboard controller. A membrane disposed beneath keys may detect key inputs and generate a signal unique to each key. The membrane may be, for example, a flexible printed circuit board with wirelines that feed to a cable so that key inputs may be uniquely identified. Lever structures may be disposed below the keycaps to bias the keys in an upwards direction. End users provide inputs by pressing on keys to overcome the bias of these lever structures, to thereby impact the membrane.

As a person of ordinary skill in the art will recognize, hovering keyboard 103 may have a variety suitable of structures for placement of keys as individual caps (or assembled as one part) and for biasing keys (such as springs, magnets, and/or other types of devices).

Electromechanical layer 103A provides a grid of circuits underneath the keys of keyboard 103 that forms an N×M matrix. These circuits are configured to generate signals in response to the user pressing the keys. For example, the circuits may be broken underneath the keys such that, when a user depresses a given key, the electric circuit underneath that key is completed. Keyboard controller 300 receives a signal output by that circuit and compares the location of the circuit to a character map stored in its memory to determine which key was physically pressed.

Backlight illumination layer 103B may include an Organic Light Emitting Diode (OLED) material, such as an OLED film that is selectively powered with an electrical current under the control of keyboard controller 300. The OLED film be disposed at various locations of keyboard's structure in order to obtain desired illumination at selected keys. For example, the OLED film may be deposited directly on electrical contacts of membrane 103B so that a controller may selectively illuminate OLED film under any keycap, by applying an electrical current to it. In some cases, backlight illumination layer 103B may further include a lightguide structure or the like, configured to route light from its LED source to a particular keycap through keyboard 103.

Proximity sensing layer 103C provides keyboard 103 with the ability to detect keypresses without the end user making physical contact with key caps. The proximity sensors of sensing layer 103C may comprise any of a number of different types of known sensors configured to measure a distance or proximity of an object, and to produce corresponding signals in response. In some implementations, proximity sensors may overlay or lie underneath the keys of hovering keyboard 103. In other implementations, sensors may be integrated within each respective key.

Figures 2, 3:
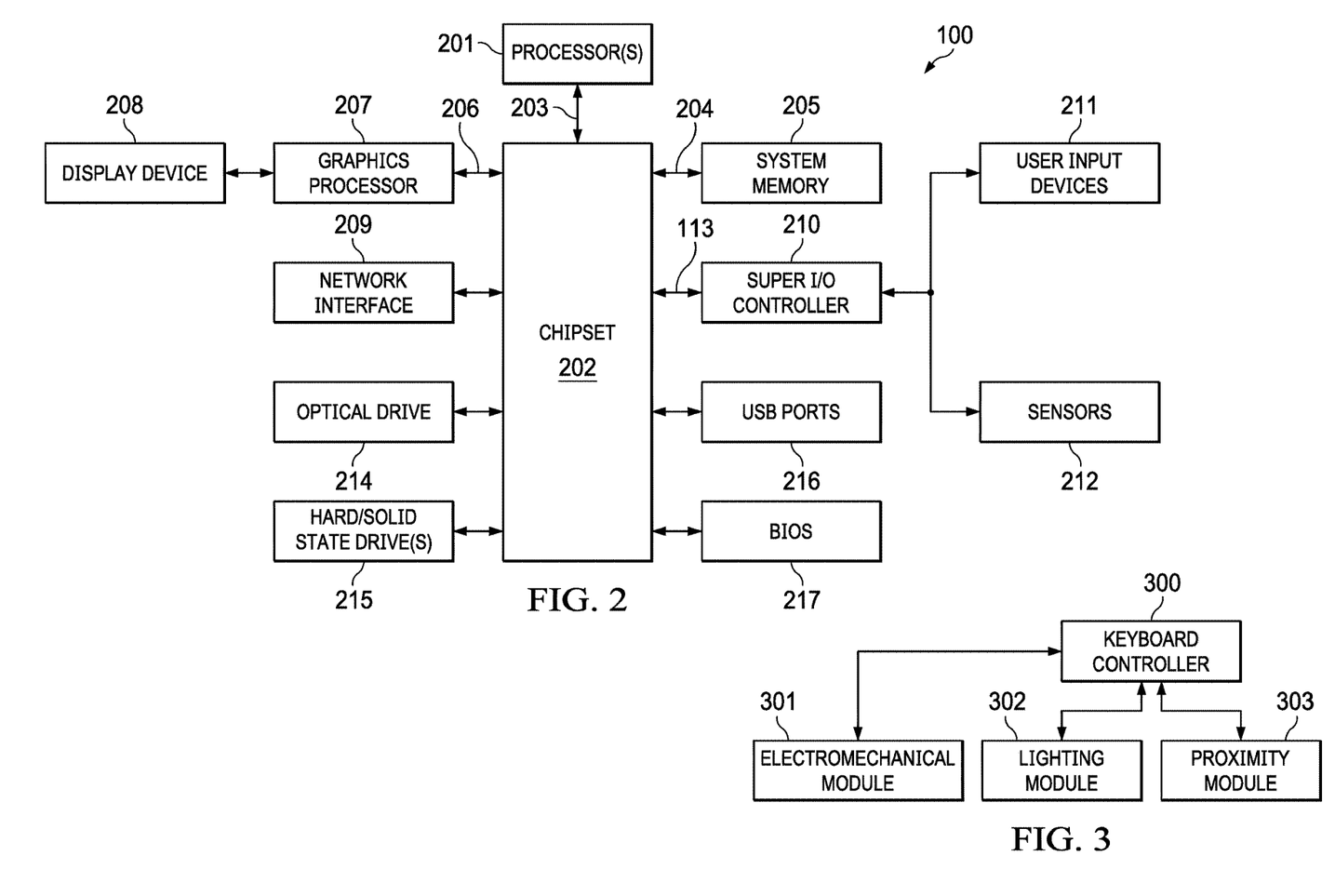
FIG. 2 is a block diagram of electronic components of an IHS, according to some embodiments.
FIG. 3 is a block diagram of electronic components of a hovering keyboard, according to some embodiments.

In the embodiment of FIG. 1, the proximity sensors may include a grid of sensors underneath the keys of keyboard 103 disposed on layer 103C. The proximity sensors may be capacitive sensors configured such that their electric fields (sensing fields) are directed through the key caps and upward from the top surface keyboard 103. The proximity sensors are configured to detect an object such as a user's fingers, and to produce signals representative of the proximity of the object. Keyboard controller 300 may process these signals to determine the position and/or movement of the detected object relative to the proximity sensors, and to capture inputs having certain characteristics as corresponding hovering keystrokes.

In some implementations, the detection of hovering keystrokes via proximity sensing layer 103C may take place in addition, or as an alternative to, the concurrent detection of physical keystrokes by electromechanical layer 103A.

FIG. 2 is a block diagram of components of IHS 100. Particularly, IHS 100 may include one or more processors 201. In various embodiments, IHS 100 may be a single-processor system including one processor 201, or a multi-processor system including two or more processors 201. Processor(s) 201 may include any processor capable of executing program instructions, such as an INTEL PENTIUM series processor or any general-purpose or embedded processors implementing any of a variety of Instruction Set Architectures (ISAs), such as an x86 ISA or a Reduced Instruction Set Computer (RISC) ISA (e.g., POWERPC, ARM, SPARC, MIPS, etc.).

IHS 100 includes chipset 202 that may have one or more integrated circuits coupled to processor(s) 201. In certain embodiments, the chipset 202 may utilize a DMI (Direct Media Interface) or QPI (QuickPath Interconnect) bus 203 for communicating with processor(s) 201.

Chipset 202 provides processor(s) 201 with access to a variety of resources. For instance, chipset 202 provides access to system memory 205 over memory bus 204. System memory 205 may be configured to store program instructions and/or data accessible by processors(s) 201. In various embodiments, system memory 205 may be implemented using any suitable memory technology, such as static RAM (SRAM), synchronous dynamic RAM (SDRAM), nonvolatile/Flash-type memory, or any other type of memory.

Chipset 202 may also provide access to graphics processor 207. In certain embodiments, graphics processor 207 may be part of one or more video or graphics cards that have been installed as components of IHS 100. Graphics processor 207 may be coupled to chipset 202 via graphics bus 206 such as provided by an Accelerated Graphics Port (AGP) bus, or a Peripheral Component Interconnect Express (PCIe) bus. In certain embodiments, graphics processor 207 generates display signals and provides them to display device 208. In certain embodiments, display device 208 may be a touch-sensitive display.

In some implementations, chipset 202 may also provide access to one or more user input devices 211. For instance, chipset 202 may be coupled to super I/O controller (SIO) 210 or an embedded controller (EC) via eSPI (Enhanced Serial Peripheral Interface) or Low-Pin Count (LPC) bus 213, and SIO 210 may provide interfaces for a variety of user input devices 211 (e.g., lower bandwidth and low data rate devices). Particularly, SIO 210 may provide access to keyboard 103 and a mouse, or other peripheral input devices such as keypads, biometric scanning devices, and voice or optical recognition devices.

SIO 210 may also provide an interface for communications with one or more sensor devices 212, which may include environment sensors, such as a temperature sensor or other cooling system sensors. These I/O devices, such as user input devices 211 and sensor devices 212, may interface with SIO 210 through wired or wireless connections.

Other resources may also be coupled to processor(s) 201 of IHS 100 through chipset 202. For example, chipset 202 may be coupled to network interface 209, such as a Network Interface Controller (NIC). In certain embodiments, network interface 209 may be coupled to chipset 202 via a PCIe bus. Network interface 209 may support communication via various wired and/or wireless networks.

Chipset 202 may also provide access to one or more hard disk and/or solid state drives 215. In certain embodiments, chipset 202 may also provide access to one or more optical drives 214 or other removable-media drives. Any or all of drive devices 214 and 215 may be integral to IHS 100, or they may be located remotely. Chipset 202 may also provide access to one or more Universal Serial Bus (USB) ports 216.

In certain implementations, chipset IHS 202 may support an I$^2$C (Inter-Integrated Circuit) bus that may be used to communicate with various types of microcontrollers, microprocessor and integrated circuits that are typically integrated components of the motherboard of the IHS 100 and perform specialized operations. For example, such an I$^2$C bus may be utilized to transmit and receive keystroke and hovering keystroke information from an attached keyboard device, and to provide that information to an operating system (OS) executed by IHS 100.

Another resource that may be accessed by processor(s) 201 via chipset 202 is Basic Input/Output System (BIOS) 217. Upon booting of IHS 100, processor(s) 201 may utilize BIOS 217 instructions to initialize and test hardware components coupled to IHS 100 and to load an OS for use by IHS 100. BIOS 217 provides an abstraction layer that allows the OS to interface with certain hardware components that are utilized by IHS 100. The Unified Extensible Firmware Interface (UEFI) was designed as a successor to BIOS; many modern IHSs utilize UEFI in addition to or instead of a BIOS. As used herein, BIOS is also intended to encompass UEFI.

Chipset 202 may also provide an interface for communications with one or more sensors 212. Sensors 212 may be disposed within display 101, chassis 102, keyboard 103, hinge 104, and/or trackpad 105, and may include, but are not limited to: electric, magnetic, radio, optical, infrared, thermal, force, pressure, acoustic, ultrasonic, proximity, position, deformation, bending, direction, movement, velocity, gyroscope, rotation, and/or acceleration sensor(s).

In various embodiments, keyboard controller 300 (shown in FIG. 3) may utilize different interfaces for communicating with the OS of IHS 100. For instance, keyboard controller 300 may interface with the chipset 202 via super I/O controller 210.

FIG. 3 is a block diagram of electronic components of hovering keyboard 103. As depicted, components of keyboard 103 include keyboard controller or processor 300 coupled to electromechanical module 301, lighting module 302, and proximity module 303. Each of modules 301-303 may include electronic circuits and/or program instructions that enable that module to communicate with keyboard controller 300.

Electromechanical module 301 may be used to control the operation of and/or to detect events originated by electromechanical layer 103A, lighting module 302 may be used to control the operation of backlight illumination layer 103B, and proximity module 303 may be used to control the operation of and/or to detect events originated by proximity sensing layer 103C. In other implementations, an additional wireless communication module (not shown) may be coupled to keyboard controller 300 to enable communications between keyboard 103 and IHS 100 using a suitable wireless protocol.

Keyboard controller 300 may be configured to detect and identify individual physical keypresses or keystrokes made by the end user via electromechanical layer 103A. Keyboard controller or processor 300 may also be configured to control the operation of each individual LED of backlight illumination layer 103B using parameters such as, for example, a selected location (e.g., in an N×M matrix, as an identified key or set of keys, etc.), a selected color (e.g., when the backlight includes RGB LEDs), and a selected intensity (e.g., brighter or dimmer). In addition, keyboard controller 300 may be configured to detect and identify individual hovering keypresses made by the end user via proximity sensing layer 103C.

In various embodiments, IHS 100 and/or hovering keyboard 103 may not include all of components shown in FIGS. 2 and 3, respectively. Additionally, or alternatively, IHS 100 and/or hovering keyboard 103 may include components in addition to those shown in FIGS. 2 and 3, respectively. Additionally, or alternatively, components represented as discrete in FIGS. 2 and 3 may instead be integrated with other components. For example, all or a portion of the functionality provided by these various components may be provided as a System-On-Chip (SOC), or the like.

Figure 4:
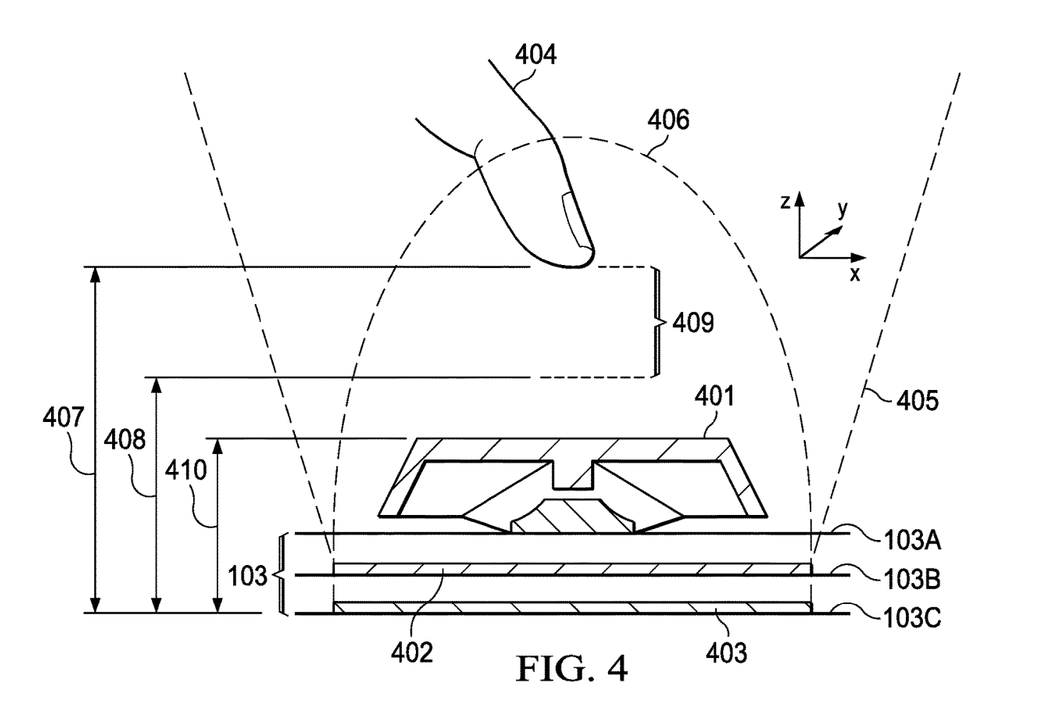
FIG. 4 is sectional view of a hovering keyboard in operation, according to some embodiments.

FIG. 4 is sectional view of hovering keyboard 103 in operation, according to some embodiments. As depicted, hovering keyboard 103 includes electromechanical layer 103A, backlight illumination layer 103B, and proximity sensing layer 103C. Electromechanical layer 103A hosts a key assembly, which includes keycap 401 as well as a dome, switches, and/or levers configured to receive and capture physical keystrokes.

Backlight illumination layer 103B includes lighting element 402 under key assembly 401. Illumination element 402 may include one or more LEDs (or one or more transparent areas from where light can exist a light guide, for example) that are configured to shine light 405, using one or more selected parameters (e.g., color, intensity, etc.), under keycap 401. In some cases, element 402 may be disposed in a matrix of like elements as part of backlight illumination layer 103B, each element located under a corresponding key of electromechanical layer 103A.

Proximity sensing layer 103C includes proximity sensor 403 under key assembly 401, such as a capacitive sensor, an infrared sensor, or an ultrasonic sensor that is configured to provide sensing field 406. Examples of suitable proximity sensors include GESTIC sensors from Microchip Technology Inc. In some cases, proximity sensor 403 may be disposed in a matrix of similar elements on proximity sensing layer 103C, and each proximity sensor may be located under a respective key of electromechanical layer 103A.

In this example, assume that the user's finger or fingertip 404 is resting at position 407 relative to proximity sensing layer 103C. When finger 404 travels by a selected or configurable distance 409 (in the vertical axis "z") to position 408 from proximity sensing layer 103C, the disturbance caused by the user's finger 404 upon sense field 406 triggers detection of a hovering keypress corresponding to keycap 401—without finger 404 having to touch keycap 401.

In some cases, height 407 may be configured to become aligned with the height of keycap 401, shown here as height 410. In that case, a hovering keypress can be detected when key cap 401 travels by distance 409 (e.g., 1 mm or 2 mm) from its initial position—a shorter travel distance (and less force) than a physical keypress would require.

In some implementations, the flickering or snapping action of a fingertip by travel distance 409 may be interpreted as a hovering keystroke. An initial value (e.g., 2 mm) for travel distance 409 may be set during a calibration or training phase. Thereafter, in order to detect hovering keystrokes with reduced latency, processor 201 and/or 300 may be configured to predict hovering keypresses based upon the user's behavior.

Figure 5A:
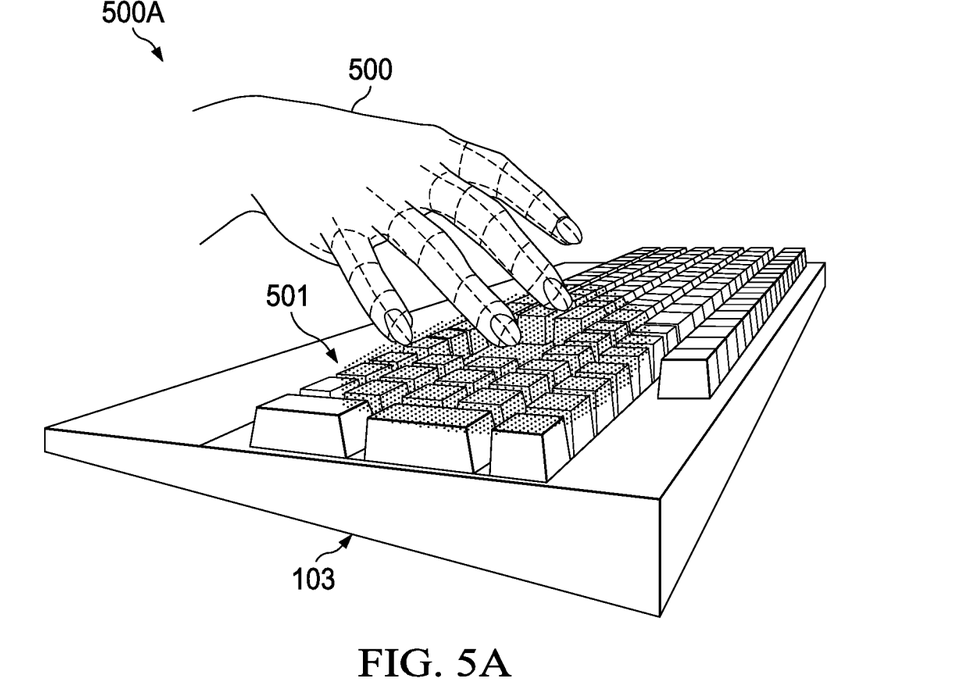
FIGS. 5A and 5B are diagrams of a hovering keyboard being used to detect hand gestures, according to some embodiments.
Figure 5B:
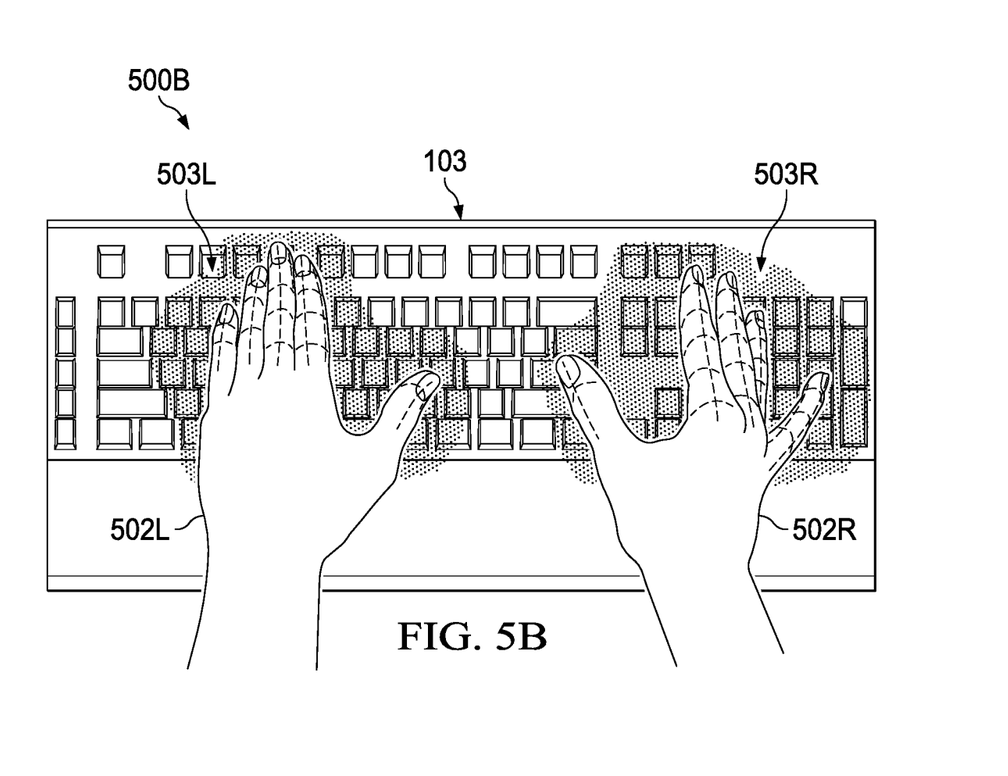

FIGS. 5A and 5B show hovering keyboard 103 being used to detect hand gestures according to some embodiments. Particularly, in configuration 500A, a user's hand 500 hovers over keyboard 103 and performs a single-handed gesture (e.g., a swiping gesture) in the position indicated by light pattern 501. Different colors and/or brightness settings may be applied to light pattern 501 under selected keycaps, for example, to guide a user's hand to a proper position.

For instance, selected key caps may light up with an intensity proportional to the distance between the hand and those keys, such that the amount of light increases (or the color changes) as the user moves hand 500 toward those keys. Then, the same lights (or all lights) may blink a number of times when the user reaches the proper position for detection, or when a gesture sequence is recognized. As a person of ordinary skill in the art will recognize, however, other suitable lighting patterns or instructions may be used.

Configuration 500B of FIG. 5B shows left hand 502L and right hand 502R resting over hovering keyboard 103 above light patterns 503L and 503R, respectively. In this case, areas 503L and 503R indicate expected or identified two-handed gestures (e.g., two concurrent swipes). Moreover, the IHS may light up selected keys 503L and 503R corresponding to the position of hands 502L and 502R over hovering keyboard 103, such that each of the selected keys is lit with a color and/or a brightness corresponding to a current distance between a portion of the hand above the selected keys and the hovering keyboard 103.

Figure 6:
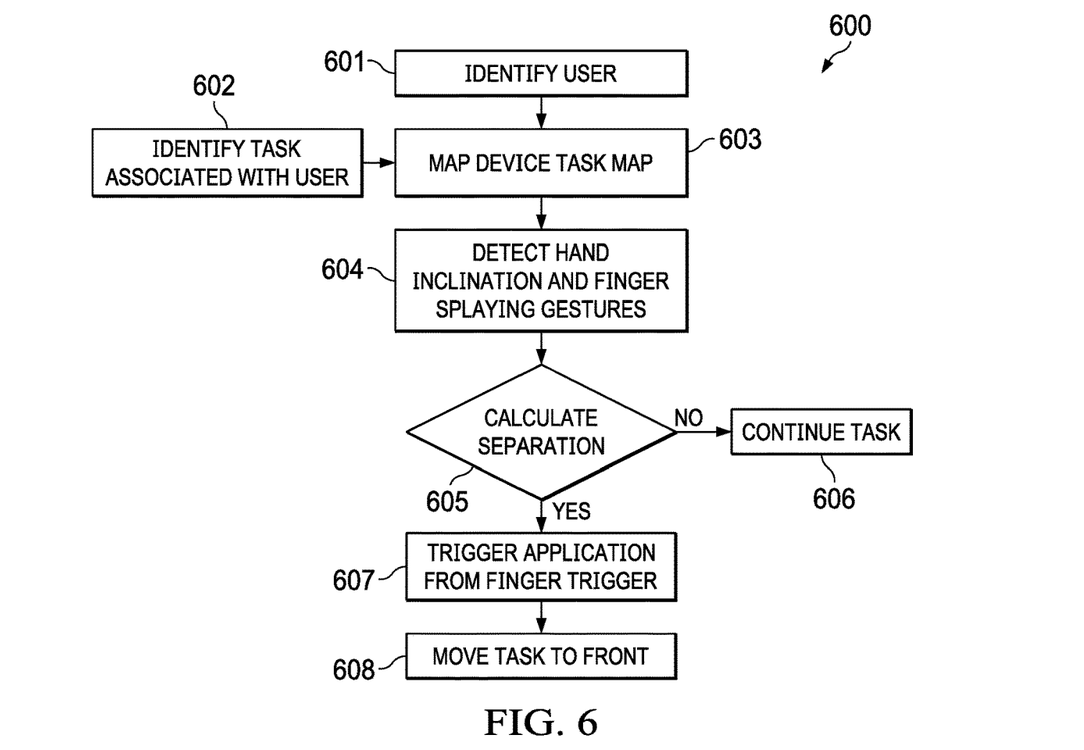
FIG. 6 is a flowchart of a method for enabling a Graphical User Interface (GUI) manipulation using hand gestures over a hovering keyboard, according to some embodiments.

FIG. 6 is a flowchart of a method for enabling a Graphical User Interface (GUI) manipulation using hand gestures over a hovering keyboard, according to some embodiments. In various implementations, program instructions for executing method 600 may be stored in memory 205 and are executable by processor(s) 201. In some cases, method 600 may be performed by one or more standalone software applications, drivers, libraries, or toolkits, accessible via an Application Programming Interface (API) or the like. Additionally, or alternatively, method 600 may be performed by the IHS's OS.

Method 600 begins at block 601, where it identifies the user of the IHS. For example, block 601 may identify a user by its login information, biometric information, etc. At block 602, method 600 identifies one or more tasks associated with the user. Examples of tasks include software applications being executed or files being manipulated during the user's current session. Typically, each software application is displayable as a window or widget on a GUI rendered on display 101.

Figure 7:
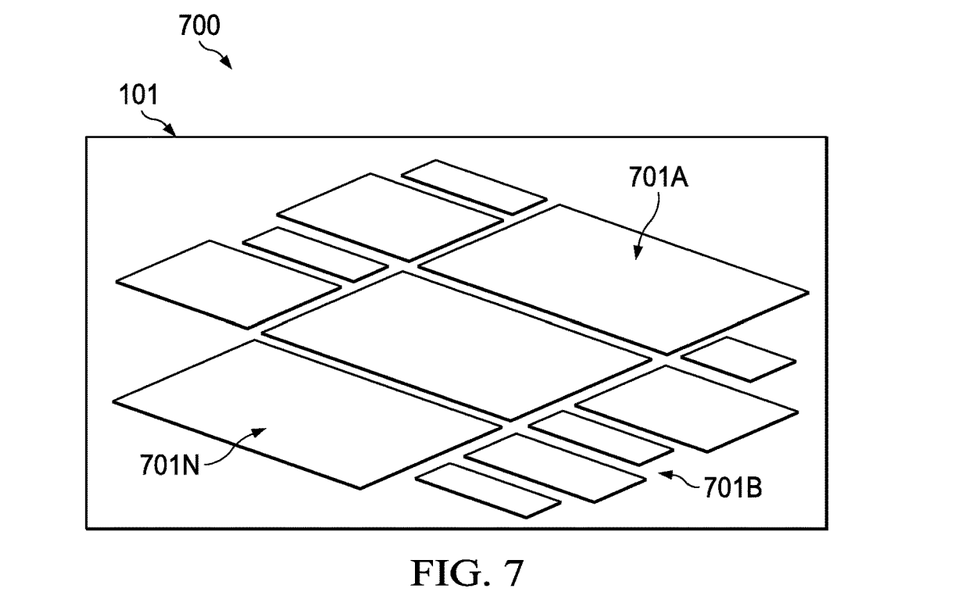
FIG. 7 is a screenshot of a task management application with multiple items rendered on a single plane, according to some embodiments.

At block 603, a task management application produces a task map. Examples of tasks include, but are not limited to, software applications, application windows, widgets, processes, or the like, currently being executed by IHS 100. FIG. 7 is an example of screenshot 700 of a task map rendered on display 101. In this implementation, a task management application produces multiple items 701A-N rendered on a single plane, in a perspective view. Each of items 701A-N may correspond to a specific task. In some cases, a task map may be invoked in response to a keypress (physical or hovering), keypress combination, or hand gesture.

At block 604, method 600 begins detecting the user's hand(s) with proximity sensors 403 while the user performs single-handed or two-handed gestures, physical keystrokes, or hovering keystrokes. In particular, method 600 may detect a hand inclination gesture and a finger splaying gesture, as described in more detail below.

Detection at block 604 starts when proximity sensor data is received at IHS 100 from proximity sensing layer 103C of hovering keyboard 103. In some implementations, proximity sensor data may be processed, to some degree, by keyboard controller 300. Then, the proximity sensor data may be further processed by processor(s) 201.

For example, proximity signals that exhibit above-threshold distances and/or motion over a suitable time interval are collected, and then processor(s) 201 attempts to match the captured proximity sensor data to a geometric model of a user's hand. If a suitable match is found, then the hand may be recognized as that of the corresponding user.

In some embodiments, processor(s) 201 be configured to analyze proximity signals from each distinct sensor in order to determine what part of the user's hand each signal represents. A number of different hand-part assignment techniques may be used. For instance, each signal may be assigned a hand-part index. The hand-part index may include a discrete identifier, confidence value, and/or hand-part probability distribution indicating the hand part or parts to which that signal is likely to correspond.

Machine learning may be used to assign each signal a hand-part index and/or hand-part probability distribution. A machine-learning module may analyze a user's hand with reference to information learned from a previously trained collection of known hands and/or hand features.

During a training phase, a variety of hand positions may be observed, and trainers may label various classifiers in the observed data. The observed data and annotations may then be used to generate one or more machine-learned algorithms that map inputs (e.g., observation data from proximity sensors) to desired outputs (e.g., hand-part indices for relevant signals).

Thereafter, a partial virtual skeleton may be fit to at least one hand part identified. In some embodiments, a hand-part designation may be assigned to each skeletal segment and/or each joint. Such virtual skeleton may include any type and number of skeletal segments and joints, including each individual finger.

In some embodiments, each joint may be assigned a number of parameters, such as, for example, Cartesian coordinates specifying its position, angles specifying its rotation, and other parameters (e.g., open hand, closed hand, length, width, joint position, angle of joint rotation, and a description of any finger segment). Then, a virtual skeleton may be fit to each of a sequence of hand parts identified from the proximity sensor data.

Still referring to block 604, method 600 determines whether a particular gesture is being or has been performed. For example, a "gesture" may have a Start phase (S) with a standalone gesture, a motion phase (M) with a sequence of gestures following each other, and an end phase (E) with another standalone gesture. In some embodiments, a look-up table may be used to store key attributes and/or reference images of start, motion, and end phases for each gesture sequence to be recognized, for two-handed and one-handed cases. As used herein, the term "look-up table" or "LUT" refers to an array or matrix of data that contains items that are searched. In many cases, an LUT may be arranged as key-value pairs, where the keys are the data items being searched (looked up) and the values are either the actual data or pointers to where the data are located.

The training phase may store user-specific finger/hand attributes (e.g., asking user 101 to splay fingers), such as motion velocity or asynchrony. For example, a start or end phase LUT may be created to include reference images or attributes, whereas a motion phase LUT may be created to include relative 6-axes data. The amount of time a user has to hold their hands and/or fingers in position for each phase of gesture sequence (S, M, and E) may be configurable.

For example, to recognize a hand inclination gesture, method 600 may detect a flat hand hovering over keyboard 103 with palm down and fingers stretched out and held together, with the fingertips positioned higher (or lower) than the wrist with respect to proximity sensing layer 103C. As part of the gesture recognition process, block 604 may calculate an angle of inclination of the user's hand. Then, to recognize a finger splaying gesture following the hand inclination gesture, method 600 detects the same flat hand hovering over keyboard 103 with palm still down, but now with fingers spread apart. Block 604 may also calculate an amount (e.g., average distance between finger tips, knuckles, etc.) of separation between fingers.

Figure 8:
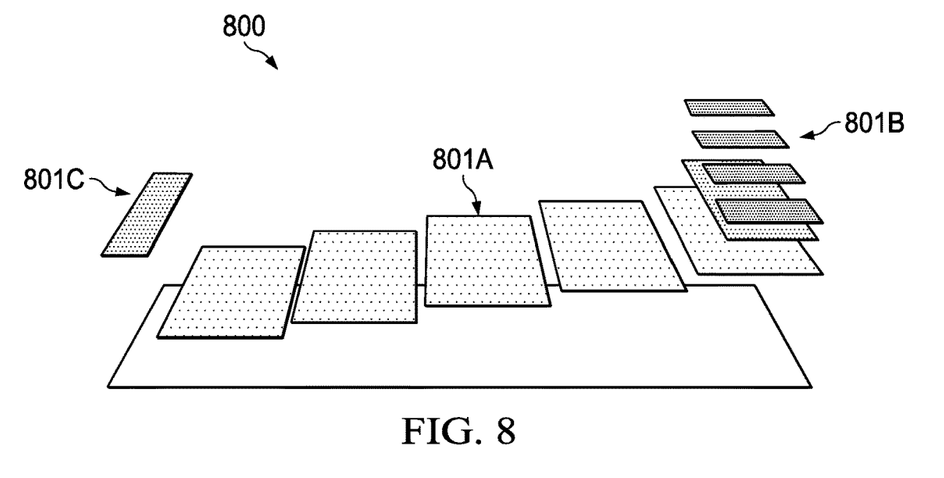
FIG. 8 is a diagram of a stack of items manipulated using hand gestures, according to some embodiments.

At block 605, method 600 manipulates items 701A-N of task map 700, represented in FIG. 8, using the calculated angle of hand inclination and/or finger separation. Particularly, FIG. 8 is a diagram of stack 800 of items 701A-N manipulated using hand gestures, according to some embodiments. As shown, stack 800 has three layers 801A-C, such that items 701A-N of the task map are also split across the three layers in selected groups. As an example, minimized applications and widows may be rendered on top layer 801B, selected OS features (e.g., a task bar, etc.) and widgets may be rendered on middle layer 801C, and open application windows may be rendered on bottom layer 801A. In other examples, however, other groupings of task items may be employed, and the order of layers in stack 800 may be different.

In some cases, the angle of inclination measured during the gesture may be used to manipulate the distances between layers 801A-C of stack 800. For example, a separation between each layer may be dynamically made proportional to a current angle of inclination of the hand over hovering keyboard 103. By tilting the hand more or less, the user can spread layers 801A-C apart or join them together, respectively. In some cases, when the user's hand is horizontal (the angle of inclination is zero), all layers 801A-C become co-planar, as shown in screenshot 700.

In addition, IHS 100 may light a portion of hovering keyboard 103 under the hand inclination gesture. For example, a subset of keycaps may be illuminated with a color or intensity corresponding to the current angle of inclination.

At some point during the gesture sequence, the user starts to spread his or her fingers apart, as part of a finger splaying gesture over hovering keyboard 103. Accordingly, the distances between the user's fingers (or an average value) may be used to horizontally or vertically separate items in each respective one of layers 801A-C. For example, IHS 100 may separate the tasks grouped into a given layer by a vertical or horizontal distance proportional to an amount of finger splaying, or an average distance between fingers/knuckles.

In addition, the IHS may light a portion of the hovering keyboard under the finger splaying gesture. For example, a subset of keycaps may be illuminated with a color or intensity corresponding to the current amount of finger splaying.

At block 606, if a task selection gesture is not detected, the current task being executed by IHS 100 prior the user having invoked the task management application continues. If a selection gesture is detected at block 607, however, the selected task may be brought to the front of the GUI of display 101, potentially covering other non-selected tasks. In some cases, the selection gesture may be made with the same hand that performs the hand inclination and finger splaying gestures. In other cases, however, the selection gesture may be made with the other hand.

An example of a task selection gesture includes a finger pointing gesture, with the middle, ring, and pinky fingers curled onto the palm of the hand, with the exception of index finger, which remain stretched out. In other cases, the task selection process may be a hovering keystroke over a keycap corresponding to a specific task on the task map.

In some cases, a different height 407 or travel distance 409 may be used to trigger detection of a hovering keystroke depending upon where the selected task sits with respect to other layers 801A-C in stack 800. For example, distance 409 may be smaller for tasks grouped into top layer 801B than from tasks grouped in bottom layer 801A.

Figure 9:
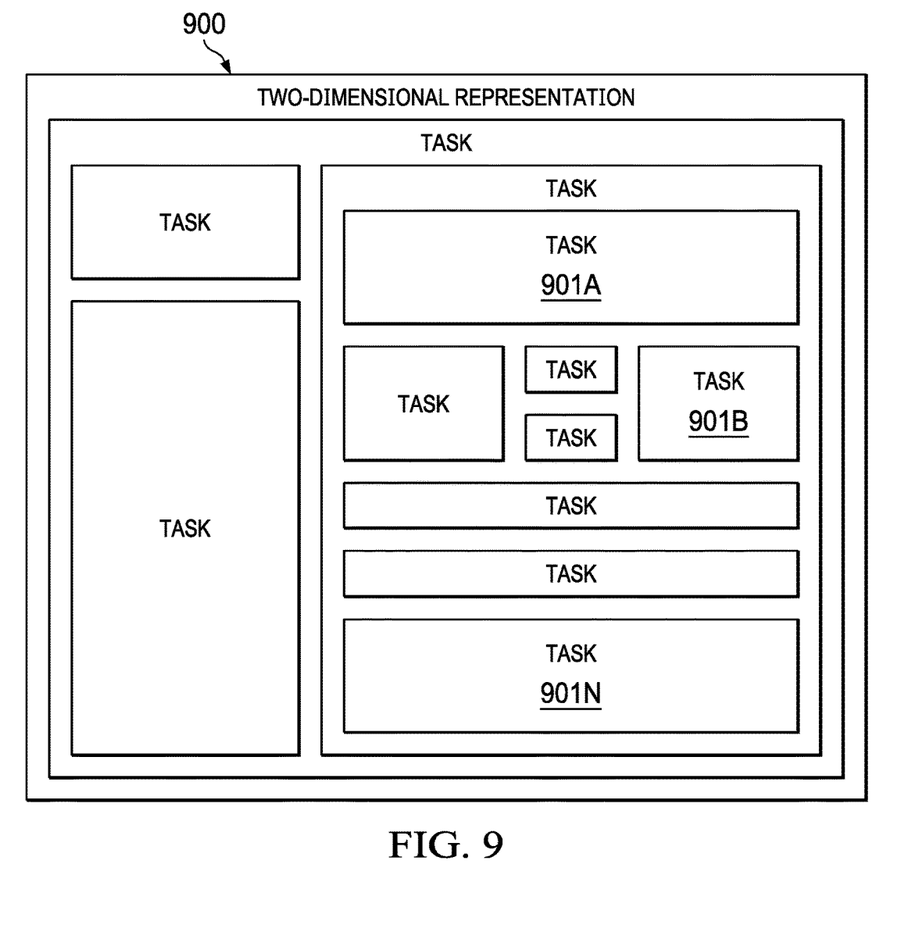
FIG. 9 is a diagram of a two-dimensional task map, according to some embodiments.

FIG. 9 is a diagram of an example a two-dimensional representation 900 of stack 800. In some embodiments, different areas 901A-N of hovering keyboard 103 and/or different keycaps may be mapped to a different task. When the user performs a hovering keystroke or selection gesture over a given area 901A-N or keycap, a corresponding task may be brought to the front of the GUI, opened, or executed.

Figure 10:
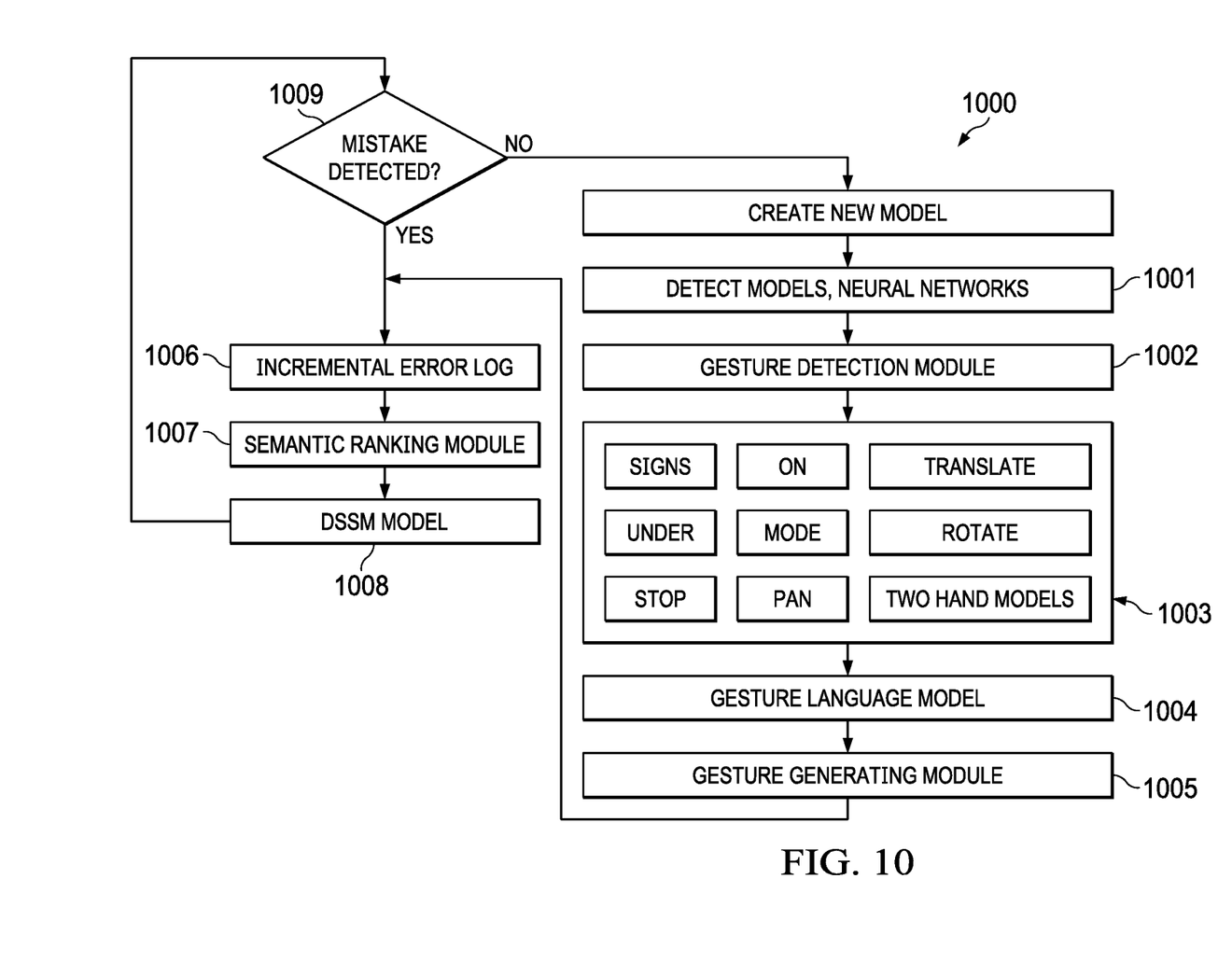
FIG. 10 is a flowchart of a method for gesture training with learning, according to some embodiments.
Figure 11:
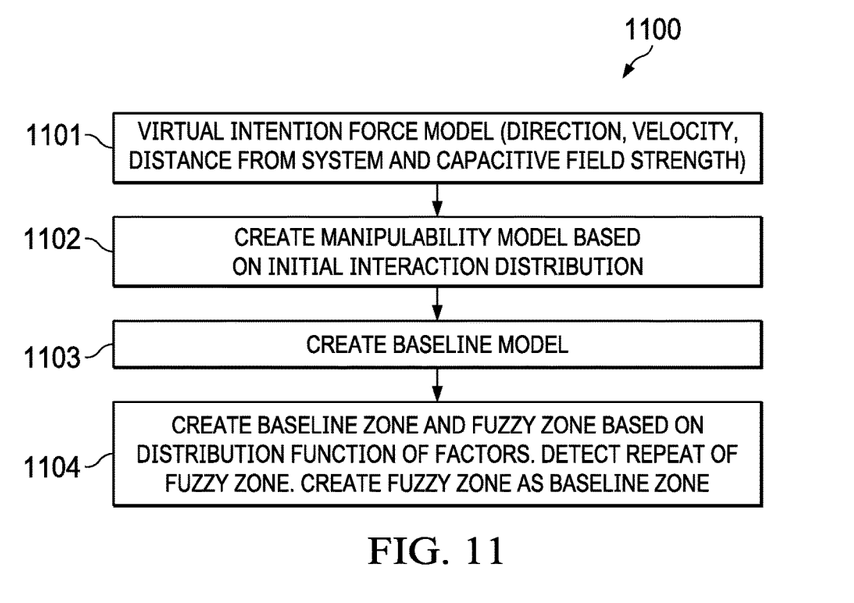
FIG. 11 is a flowchart of a method for fatigue training, according to some embodiments.
Figure 12:
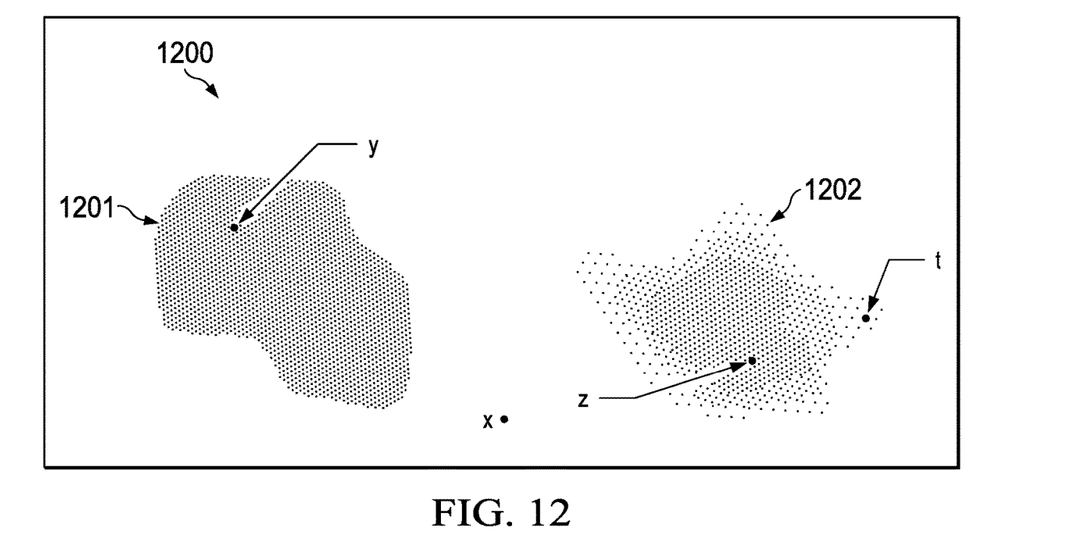
FIG. 12 is a graph illustrating baseline and fuzzy sets of hand gestures or features, according to some embodiments.

In a collaborative space, a single IHS 100 may be used by multiple users with size and fatigue considerations, which can increase gesture detection errors with time. To address this problem, systems and methods described herein may incorporate gesture training to track temporal movement, and using a convolutional neural network, adapt gestures and gesture spaces. As shown in FIGS. 10-12, these techniques may begin with a defined gesture space, expand or reduce the space based on the user, and compute movement gradient using statistical regression with time.

FIG. 10 is a flowchart of method 1000 for gesture training with learning, according to some embodiments. In various implementations, program instructions for executing method 1000 may be stored in memory 205 and are executable by processor(s) 201, for example, as a subroutine of block 604 shown in FIG. 6. In some cases, method 1000 may be performed by one or more standalone software applications, drivers, libraries, or toolkits, accessible via an Application Programming Interface (API) or the like. Additionally, or alternatively, method 1000 may be performed by the IHS's OS.

Particularly, method 1000 begins at block 1001, where one or more gesture detector models or deep neural networks operate upon gesture detection system 1002 of hovering keyboard 103 to recognize gestures or operations 1003 (e.g., signs, translate, rotate, signs, under, on, stop, mode, pan, and 2-hand models), from a selected one of a plurality of gesture language models 1004, being performed by the user.

Gesture generating module 1005 then assembles recognized operations 1003 into gestures or gesture sequences, and it stores incremental errors in log 1006. Semantic ranking module 1007 applies a Deep Semantic Similarity Model (DSSM) (e.g., a Deep Neural Network (DNN) used to evaluate semantic similarity between detected gestures and gesture sequences. When a mistake is detected at block 1009, log 1006 is updated with an incremental error record. Moreover, when the DSSM model 1008 indicates gesture drift or fatigue between different instances of the same gesture or gesture sequence over time, block 1007 may update or create a new model in block 1001 that accounts for the gesture drift or fatigue.

To determine whether or not there is gesture drift or fatigue in a user's session, DSSM model 1008 of FIG. 10 may implement method 1100 of FIG. 11 for fatigue training. Particularly, method 1100 may be used to create and apply a manipulability model. At block 1101, a virtual intention force model detects, based upon proximity sensor data from hovering keyboard 103, direction, velocity and distance, variations in capacitive field strength, etc. Then, block 1102 creates a manipulability model using an initial interaction distribution.

Block 1103 creates a baseline model as shown in block 1104, with a baseline zone and a fuzzy zone created based upon a distribution function of selected factors. Examples of a manipulability model's baseline zone or gesture set 1201 and a fuzzy zone or gesture set 1202 are shown in FIG. 12. In these examples, fuzzy zone 1202 uses a random distribution random bar of X % the baseline (e.g., 20%), such that "x" belongs to neither set 1201 nor set 1202, "y" belongs completely to set 1201, "z" belongs completely to 1202, and "t" belongs partially to set 1202. Back to method 1100, when the fuzzy zone or set is detected as a repeat, block 1104 uses the fuzzy zone as the baseline zone for subsequent classification and recognition operations.

It should be understood that various operations described herein may be implemented in software executed by logic or processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. An Information Handling System (IHS), comprising:
a processor; and
a memory coupled to the processor, the memory having program instructions stored thereon that, upon execution by the processor, cause the IHS to:
render a task map on a display coupled to the IHS, the task map comprising a plurality of items each representing a specific task to be performed by the IHS when its respective item is selected, wherein each of the plurality of items are simultaneously displayed on the display, wherein the specific tasks corresponding to the plurality of items are different from one another, and wherein each of a plurality of items are grouped in two or more layers;
detect a hand inclination gesture of a hand using proximity sensors disposed on a hovering keyboard coupled to the IHS; and
manipulate the task map by adjusting a separation between each layer to be proportional to a detected angle of inclination of the hand.

2. The IHS of claim 1, wherein to detect the hand gesture, the program instructions, upon execution, cause the IHS to fit proximity data obtained by the proximity sensors to a geometric model of a hand, and wherein the geometric model comprises one or more parameters selected from the group consisting of: a length, a width, a joint position, an angle of joint rotation, and a finger segment.

3. The IHS of claim 1, wherein the program instructions, upon execution, further cause the IHS to light a portion of the hovering keyboard under the hand inclination with a color or intensity corresponding to the angle of inclination.

4. The IHS of claim 1, wherein the hand gesture further comprises a finger splaying following the hand inclination.

5. The IHS of claim 4, wherein to manipulate the task map, the program instructions, upon execution, further cause the IHS to separate the tasks rendered in each layer by a distance proportional to an amount of finger splaying.

6. The IHS of claim 5, wherein the hand gesture further comprises a finger pointing following the finger splaying.

7. The IHS of claim 6, wherein to manipulate the task map, the program instructions, upon execution, further cause the IHS to identify one of the plurality of tasks selected by the finger pointing, and to render an application associated with the selected task.

8. The IHS of claim 4, wherein the program instructions, upon execution, further cause the IHS to light a portion of the hovering keyboard under the finger splaying with a color or intensity corresponding to the amount of finger splaying.

9. The IHS of claim 1, wherein to manipulate the task map, the program instructions, upon execution, further cause the IHS to:
maintain a record of hand gestures performed by a given user;
calculate a drift based on the record of hand gestures; and
adjust one or more parameters used to detect the hand gesture based upon the drift.

10. The IHS of claim 9, wherein to calculate the drift, the program instructions, upon execution, further cause the IHS to create a fuzzy set of hand gestures.

11. A method, comprising:
rendering a task map on a display coupled to the IHS, the task map comprising a plurality of items each representing a specific task to be performed by the IHS when its respective item is selected, wherein each of the plurality of items are simultaneously displayed on the display, wherein the specific tasks corresponding to the plurality of items are different from one another, and wherein each of a plurality of items are grouped in two or more layers;
detecting a hand inclination gesture of a hand using proximity sensors disposed on a hovering keyboard coupled to an Information Handling System (IHS); and
manipulating the task map by adjusting a separation between each layer to be proportional to a detected angle of inclination of the hand.

12. The method of claim 11, wherein the hand gesture further comprises a finger splaying following the hand inclination, and wherein the method further comprises separating the tasks rendered in each layer by a distance proportional to an amount of finger splaying.

13. The method of claim 12, wherein the hand gesture further comprises a finger pointing following the finger splaying, and wherein the method further comprises identifying one of the plurality of tasks selected by the finger pointing, and rendering an application associated with the selected task.

14. A hardware memory device having program instructions stored thereon that, upon execution by a processor of an Information Handling System (IHS), cause the IHS to:
render a task map on a display coupled to the IHS, the task map comprising a plurality of items each representing a specific task to be performed by the IHS when its respective item is selected, wherein each of the plurality of items are simultaneously displayed on the display, wherein the specific tasks corresponding to the plurality of items are different from one another, and wherein each of a plurality of items are grouped in two or more layers;
detect a hand inclination gesture of a hand using proximity sensors disposed on a hovering keyboard coupled to the IHS; and
manipulate the task map by adjusting a separation between each layer to be proportional to a detected angle of inclination of the hand.

15. The hardware memory device of claim 14, wherein the hand gesture further comprises a finger splaying following the hand inclination, and wherein the program instructions, upon execution, further cause the IHS to separate the tasks rendered in each layer by a distance proportional to an amount of finger splaying.

16. The hardware memory device of claim 15, wherein the hand gesture further comprises a finger pointing following the finger splaying, and wherein the program instructions, upon execution, further cause the IHS to identify one of the plurality of tasks selected by the finger pointing, and to render an application associated with the selected task.

* * * * *